United States Patent [19]

Benedikt et al.

[11] Patent Number: 4,902,556
[45] Date of Patent: Feb. 20, 1990

[54] MULTI-LAYER POLYNORBORNENE AND EPOXY LAMINATES AND PROCESS FOR MAKING THE SAME

[75] Inventors: George M. Benedikt, Macedonia; David M. Aleksa, Parma, both of Ohio

[73] Assignee: The B. F. Goodrich Company, Akron, Ohio

[21] Appl. No.: 302,206

[22] Filed: Jan. 27, 1989

[51] Int. Cl.$^4$ .......................... B32B 3/00; H05K 1/00; B44C 1/22; C23F 1/02

[52] U.S. Cl. ..................................... 428/209; 29/846; 156/630; 156/634; 156/656; 156/659.1; 156/666; 156/902; 174/68.5; 428/416; 428/601; 428/626

[58] Field of Search ...................... 156/629, 630–634, 156/656, 659.1, 661.1, 666, 901, 902; 174/68.5; 361/397, 398, 412, 414; 29/846; 428/601, 626, 209, 411.1, 413, 416; 427/96

[56] References Cited

U.S. PATENT DOCUMENTS

| | | | |
|---|---|---|---|
| 3,318,758 | 5/1967 | Tell | 161/216 |
| 3,508,983 | 4/1970 | Origer et al. | 156/3 |
| 3,558,423 | 1/1971 | Rossetti, Jr. | 161/203 |
| 4,315,970 | 2/1982 | McGee | 428/412 |
| 4,358,479 | 11/1982 | Canestaro et al. | 156/630 X |
| 4,372,800 | 2/1983 | Oizumi et al. | 156/307.3 |
| 4,389,268 | 6/1983 | Oshima et al. | 156/630 X |
| 4,428,095 | 1/1984 | Frisch et al. | 156/630 X |
| 4,451,317 | 5/1984 | Oizumi et al. | 156/307.3 |
| 4,571,279 | 2/1986 | Oizumi et al. | 156/270 |
| 4,639,285 | 1/1987 | Suzuki et al. | 156/629 X |

OTHER PUBLICATIONS

Chemical Abstract No. 72:124634r, "Hybrid Polyimide/Epoxy Glass Multilayer Fabrication".
Chemical Abstract No. 98:162024m, "Metal-Covered Laminates".
Chemical Abstract No. 98:162025n, "Metal-Covered Laminates".
Chemical Abstract No. 98:162026p, "Metal-Covered Laminates".
Chemical Abstract No. 105:135048d, "Multi-Layer Circuit Boards".
Chemical Abstract No. 107:97841p, "Polycyclic Olefin Laminated Boards".
Chemical Abstract No. 107:8574p, "Epoxy Prepregs for Printed-Wiring Boards".
Chemical Abstract No. 107:8575q, "Epoxy Prepregs for Printed-Wiring Boards".
WPI No. 83-00996K/01, "Metal Glass Laminated Plate Manufacture Using Adhesive Comprising Silyl-Modified Organic Polymer".
WPI No. 83-759725/37, "Bonding Copper Foil to Backing Material Using Silane Compound as Adhesion Promoter; PCB Print Circuit Board".
WPI No. 74-34559V/19, "Metallised Plastic Substrate, e.g., Electronic Circuit—By Laminating Pretreated Metal Sheet with Plastic Substrate, Removing Metal Layer, and Metallising Exposed Surface".
WPI No. 85-162927/27, "Copper Coated Laminated Plate Production for PCB, Using Unsaturated Resin, e.g., Polyester or Vinyl Ester to Impregnate Base Material".
"Today's Substrates", Murray, *Circuits Manufacturing*, Nov. 1987, p. 25.
"G-10FR Epoxy/Glass Fabric General Purpose Laminate", Norplex, Product Bulletin.
"Adhesion in Mineral-Organic Composites", D. M. Brewis, D. Briggs, John Wiley & Sons, *Industrial Adhesion Problems*, Chapter 6.
*The Kirk–Othmer Encyclopedia of Chemical Technology*, John Wiley & Sons, 1982, vol. 20.

*Primary Examiner*—William A. Powell
*Attorney, Agent, or Firm*—Robbins & Laramie

[57] ABSTRACT

Multi-layer laminates are provided of alternating or non alternating layers of reinforced epoxy and reinforced polynorbornene. The laminates are made by a process which includes an adhesion promotion step wherein at least one of the layers, prior to lamination, is pretreated with an adhesion promotion agent. Preferred adhesion promotion agents include silanes. One or more layers of copper foil can also be employed between exterior surfaces of the layers at the interface between the layers, as well as on the exterior of the laminates. The copper films can be etched to form patterns such as those suitable for printed circuit wiring boards.

43 Claims, No Drawings

MULTI-LAYER POLYNORBORNENE AND EPOXY LAMINATES AND PROCESS FOR MAKING THE SAME

BACKGROUND OF THE INVENTION

This invention relates to printed circuit wiring boards comprising alternating layers derived from epoxy prepregs and polynorbornene prepregs. The printed circuit wiring boards of this invention may also have copper films on the outermost surfaces thereof.

In recent years multi-layer circuit boards have been developed. Such circuit boards allow for the incorporation of a much higher density of circuits in the board and thus, allow for a higher density of active devices to be built per unit area. Typical multi-layer circuit boards are manufactured by using epoxy-based prepregs.

A purpose of this invention is to produce printed circuit wire boards which have a high bonding strength.

Such laminates are generally compared in the market place for dielectric constant, dissipation factor, chemical resistance, peel strength, solder bath resistance (at 260° C. to 288° C.), warping and punchability.

In conventional processes, so called "prepregs" are made by dipping a pretreated fibrous substrate (fiberglass) in Epoxy or some other solution of polymer resin having good strength and electrical insulating properties and drying the fibrous substrate to remove the solvent and provide a resin-impregnated substrate. It is known to treat the glass substrate with a silane compound to promote the adhesion between the substrate and the resin.

Cellulosic and fiberglass woven materials have long been used to reinforce polymer substrates. It is known silane coupling agents can be applied directly to glass filaments to improve the flexural strength of glass cloth laminates of a variety of resins, often by as much as 300 percent for compression molded test samples. Silane coupling agents at the interface allow many particulate minerals to become reinforcing fillers in composites to increase strength, hardness, modulus, heat distortion and impact strength. Fiberglass cloth is usually treated with an aqueous coupling agent.

Two or more of these prepregs are then pressed together to form an insulating layer for a printed circuit wiring board. To provide the conducting layer for the laminate, one or more copper layers are generally pressed against the exposed surfaces of these prepregs.

CA72:124634r discloses a hybrid polyimide/epoxy glass multi-layer fabrication. The fabrication is a "flexible-rigid" multi-layer circuit card which is copper-clad. The epoxy is a B-stage epoxy.

CA101:135048d discloses multi-layer circuit boards. The circuit boards comprise a copper-clad epoxy glass laminate.

The product bulletin on NORPLEX (G-10 FR) discloses a general purpose laminate of epoxy/glass fabric. The fabric can be copper-clad and is suitable in many electrical and mechanical applications.

"Today's Substrates" Murray, *Circuits Manufacturing*, Nov. 1987, p. 25, discloses multi-layer boards of glass epoxy/fluoropolymer and copper film. Other laminates are disclosed as well.

*Industrial Adhesion Problems*, Brewis, John Wiley and Sons, Chapter VI, discusses the development of the use of organo-functional silanes to promote the adhesion between glass and mineral substrates and polymers. The *Kirk-Othmer Encyclopedia of Chemical Technology*, Vol. 20, 1982, presents similar disclosure.

U.S. Pat. Nos. 4,372,800; 4,451,317 and 4,571,279 disclose continuous processes for producing glass reinforced resin laminates. The processes involve the steps of impregnating plies of the glass cloth with a liquid resin and sandwiching the impregnated cloths between two electrolytic copper foils. Each copper foil is surface treated with a silane coupling agent.

Other methods of applying metals to insulating layers or substrates include vapor deposition, electroplating, sputtering, ion plating, spraying and layering. The metals commonly used are copper, nickel, tin, silver solder, gold, aluminum, platinum, titanium, zinc and chrome, with copper being used most often in printed wire boards.

A problem associated with forming thin metallic coatings on insulating layers or substrates has been the inability to form a complete bond having excellent bond strength between the metallic layer and the substrate and subsequently good solder resistance.

Thus, as indicated above, silane compounds have found wide acceptability for improving adhesion between different substrates.

Silane coupling agents modify the interface between metal or mineral surfaces and organic resins to improve adhesion between the surface and the resin. The physical properties and water resistance of the reinforced resins are thereby improved. It is believed that silane coupling agents form bonds with metal surfaces through the silane functional group. The hydrolyzed silanes will condense to oligomeric siloxanols and eventually to rigid cross-linked structures. Contact with a polymer matrix should take place while the siloxanols still have some solubility. Bonding to a polymer matrix may take different forms or a combination of forms. Bonding may be covalent where the oligomeric siloxanol is compatible with the liquid matrix resin. The solutions might also form an interpenetrating polymer network as the siloxanols and the resin separately cure with only limited copolymerization.

It is well known that not all silanes or mixtures of silanes will bond all metals to all substrates. McGee, 4,315,970, which discloses the use of silane for bonding metals to various substrates, states that > "[i]t is generally accepted that specific silanes can be used for adhesion of specific materials to specific substrates. That is, the silane must be matched to the application and it cannot be assumed that all silanes will work in all applications."

Therefore, the suitability of a silane bonding agent in improving adhesion of a metal to a substrate is unpredictable and it must be determined by experimentation.

While suitable coupling agents are commercially available for bonding of many common plastics with a variety of metals, it is believed that the application of silane coupling agents for bonding of polynorbornenes to epoxy or metals is not known in the prior art. Norbornene type monomers are polymerized by either a ring-opening mechanism or by an addition reaction wherein the cyclic ring structure remains intact. Ring-opening polymerizations are discussed with greater particularity in U.S. Pat. Nos. 4,136,247 and 4,178,424, which are assigned to the same assignee as the present invention and are incorporated herein by reference for their discussion of such polymerizations. Ring-opening polymerization generally yields unsaturated linear polymers while addition polymerization yields polycycloaliphatics. It is desirable to produce polymers having high molecular weight monomers incorporated therein to provide good temperature resistance, i.e., high heat distortion temperatures and high glass transition temperatures.

SUMMARY OF THE INVENTION

Printed wiring boards of this invention comprise a layer formed of at least one polynorbornene prepreg and a layer formed of at least one epoxy prepreg. The epoxy prepreg and the polynorbornene prepreg are laminated to each other after pretreatment of the surface of the polynorbornene prepreg with a silane coupling agent. Several polynorbornene/epoxy sequences, and several prepregs per layer, may be employed. An etched film of conductive material, preferably copper, is preferably employed between the epoxy and polynorbornene layers. This copper film is also treated with a silane coupling agent. Thus, the silane coupling agent is employed at each epoxy/norbornene interface and at each polynorbornene/copper interface.

The polynorbornene prepregs are produced from a solution of polymers obtained from polymerization of norbornene type monomers with a variety of compounds. To provide the prepregs, a non-cellulosic cloth is impregnated with the polymer solution and allowed to dry until the solvent content is about 2.5% by weight or below. Preferably this cloth is pretreated with a silane coupling agent. The copper foil is pretreated with a silane compound that is useful as a coupling agent between polynorbornene and the foil. This copper foil is typically about 35 microns thick and has a dendritic bronze surface. The laminates of this invention are preferably resistant to thermal stress in a solder bath at at least 260° C. for at least 20 seconds without copper delamination or blistering.

The laminates show low solvent swelling at room temperatures in methylene chloride of less than 40%, preferably less than 25% and even more preferably less than 15% in a 60 mil thickness sample. They have a coefficient of thermal expansion normal to the plane of the board surface preferably below 80ppm/°C.

The laminates of this invention, when used as printed wiring boards, have a low dielectric constant. The polynorbornene layers exhibit particularly low dielectric constants. Thus, the polynorbornene layers contribute to the low overall dielectric constants exhibited by the laminates of this invention. The dielectric constant of the epoxy layers is preferably not greater than 4.8 and the dissipation factor is preferably not greater than 0.02. The polynorbornene layers preferably have a dielectric constant of not greater than about 2.8-3.1, and a dissipation factor of 0.002.

In one aspect of this invention a process is provided for producing a laminate. The process comprises (a) providing a substrate layer comprising at least one polynorbornene prepreg; (b) pretreating the surface of a conductive film with a solution of a silane compound effective to increase the bond strength between the substrate layer and the conductive film, laminating the conductive film to the substrate layer and curing the substrate; (c) photo-resist imaging and etching at least a portion of the conductive film; and (d) sandwiching and laminating an additional layer, formed of at least one epoxy prepreg, between the etched surface of the substrate and the surface of an additional conductive film and curing the resultant assembly, wherein the silane employed in step (b) is effective to increase the bond strength between the metal film and the polynorbornene layer, and the polynorbornene layer and the epoxy layer.

In another aspect of this invention, a process for producing a laminate is provided comprising (a) providing a substrate layer comprising at least one epoxy prepreg; (b) laminating a conductive film to a surface of said substrate and curing the substrate; (c) photo-resist imaging and etching at least a portion of the conductive film to produce a conductive film patterned surface on the substrate; (d) providing an additional layer comprising one or more polynorbornene prepregs and pretreating the copper-patterned surface of the substrate layer with a silane solution effective to increase the bond strength between the copper-patterned surface and the polynorbornene layer; (e) pretreating the surface of an additional conductive film with a silane solution effective to increase the bond strength between the conductive film and the polynorbornene layer; and (f) sandwiching and laminating the polynorbornene layer between the copper-patterned surface of the substrate and the silane-treated surface of the conductive film and curing the entire assembly.

In yet another aspect of this invention, a process for producing a laminate is provided. The process comprises (a) providing a polynorbornene solution comprising polynorbornene polymers dissolved within a solvent; (b) impregnating a non-cellulosic cloth with the solution and drying the impregnated cloth to remove a substantial portion of solvent to form a substrate layer; (c) pretreating a surface of a sheet comprising at least partially-cured epoxy resin with a solution of a silane compound effective to increase the bond strength between the substrate layer and epoxy layer; and (d) laminating the epoxy layer to the substrate layer and curing the entire assembly.

In other aspects of this invention, laminates produced by the processes described above are provided.

DETAILED DESCRIPTION OF THE INVENTION

This invention is related to the discovery that the bond strength between layers of epoxy prepreg and polynorbornene prepreg after lamination thereof can be increased by pretreating the surfaces to be laminated of the polynorbornene prepreg layer with a silane adhesion promoting agent. While this invention is illustrated in terms of pretreatment of the polynorbornene layers, it is expected that treatment of the epoxy layer would be effective also. These laminates are particularly suitable for use in the production of printed circuit wiring boards and particularly multi-layer printed circuit wiring boards. This invention allows for the production of laminates of high bond strength and also low dielectric constant, e.g., those exemplified above. The dielectric constant and other electrical parameters are conventionally measured, for example, with an electric bridge (Gen Rad 1687-M Megahertz LC Digibridge).

In the production of multi-layer printed circuit wiring boards of this invention, a starting substrate is provided comprising one or more layers of prepreg. The prepregs are then laminated together with at least one sheet of conductive foil, preferably copper foil and more preferably, one sheet of copper foil on each side of the prepreg layer. Prior to lamination, the copper foil, substrate or both are treated with an adhesion-promoting silane solution. The lamination and cure is conducted at a pressure of up to 1,100 psi, and a temperature of from ambient to about 250° C.

After lamination, the copper foil may be subjected to conditions to form a copper circuit pattern. Thus, the sheet is preferably subjected to photo-imaging using a photo-resist, followed by etching at least a portion of the conductive layer to remove selective portions. The phrase "at least a portion" of the copper is intended to mean that at least some of the film is imaged and etched away to form a pattern and thus, at least some of the copper remains. Subsequently, the remaining copper pattern is preferably subjected to oxidation to form an oxide coating thereon. These imaging techniques are entirely conventional and very well known to those of ordinary skill in the art. Methods of fabricating multi-layer printed circuit boards, including those steps in this invention which are conventional, are disclosed in *Printed Circuits Handbook*, Coombs Jr., editor-in-chief, McGraw-Hill, 1979, Chapter 22, which is hereby incorporated by reference herein.

A layer of prepreg of a dissimilar polymer is then laminated to the substrate over the copper pattern. Thus, if the substrate were formed of a polynorbornene, a layer of epoxy prepreg would then be laminated to the substrate and vice versa. A sheet of copper foil, pretreated as in the previous step would also be laminated to the outer surface of the new polymeric layer. Preferably, the substrate is sandwiched between two layers of dissimilar polymer prepregs with copper foil on the outside of each layer. This sequence can be continued indefinitely until the desired number of layers in the multi-layer printed circuit board is reached.

Advantageously, when the conductive foil, e.g., copper film, has been pretreated with a silane coupling agent, followed by laminating and etching the copper film to produce a copper pattern on a polynorbornene substrate, the silane coupling agent is exposed and remains on the surface of the substrate. Thus, further pretreatment of the substrate layer with the silane coupling agent is not required since it is already present. Thus, pretreatment of the copper film also results in pretreatment of the substrate layer. Optionally, a silane treatment of the imaged substrate may be used to further increase the bond stength. In cases where epoxy forms the substrate layer, pretreatment of the copper film to provide good adhesion to the epoxy is not required. In such cases, the copper film is laminated directly onto the epoxy prepreg. The film is then subjected to photo-resist imaging and etching followed by copper pattern oxidation, surface treatment with a silane adhesion promoter effective to increase the bond strength between the copper image and the polynorbornene layer and between the epoxy surface and the polynorbornene layer, and subsequently lamination with the polynororrnene layer and cure of the system.

In the production of non-conductive structural laminates of this invention, the copper foil may be omitted.

In this invention, the polynorbornene prepregs are derived from a polynorbornene dipping solution. This polynorbornene dipping solution comprises solubilized polynorbornene polymers. These polymers are obtained from the metathesis ring-opening polymerization of cycloolefin monomers having a norbornene functional group.

These cycloolefin monomers are characterized by the presence of at least one norbornene moiety the structure of which is identified below:

Suitable cycloolefin monomers include substituted and unsubstituted norbornenes, dicyclopentadienes, dihydrodicyclopentadienes, trimers of cyclopentadiene, tetracyclododecenes, hexacycloheptadecenes, ethylidenyl norbornenes and vinylnorbornenes. Substituents on the cycloolefin monomers include hydrogen, alkyl, alkenyl, and aryl groups of 1 to 20 carbon atoms, and saturated and unsaturated cyclic groups of 3 to 12 carbon atoms which can be formed with one or more, preferably two, ring carbon atoms. In a preferred embodiment, the substituents are selected from hydrogen and alkyl groups of 1 to 2 carbon atoms. Generally speaking, the substituents on the cycloolefin monomers can be any which do not poison or deactivate the polymerization catalyst. Examples of the preferred monomers referred to herein include,
dicyclopentadiene,
methyltetracyclododecene,
2-norbornene,
and other norbornene monomers such as
5-methyl-2-norbornene,
5,6-dimethyl-2-norbornene,
5-ethyl-2-norbornene,
5-ethylidenyl-2-norbornene (or 5-ethylidene-norbornene),
5-butyl-2-norbornene,
5-hexyl-2-norbornene,
5-octyl-2-norbornene,
5-phenyl-2-norbornene,
5-dodecyl-2-norbornene,
5-isobutyl-2-norbornene,
5-octadecyl-2-norbornene,
5-isopropyl-2-norbornene,
5-phenyl-2-norbornene,
5-p-toluyl-2-norbornene,
5-α-naphthyl-2-norbornene,
5-cyclohexyl-2-norbornene,
5-isopropenyl-norbornene,
5-vinyl-norbornene,
5,5-dimethyl-2-norbornene,
tricyclopentadiene (or cyclopentadiene trimer),
tetracyclopentadiene (or cyclopentadiene tetramer),
dihydrodicyclopentadiene (or cyclopentenecyclopentadiene co-dimer),
methyl - cyclopentadiene dimer,
ethyl - cyclopentadiene dimer,
tetracyclododecene
9-methyl-tetracyclo[6,2,1,1$^{3,6}$,0$^{2,7}$]dodecene-4, (or methyl-tetracyclododecene)
9-ethyl-tetracyclo[6,2,1,1$^{3,6}$,0$^{2,7}$]dodcene-4, (or ethyl-tetracyclododecene)
9-propyl-tetracyclo[6,2,1,1$^{3,6}$,0$^{2,7}$]dodecene-4,
9-hexyl-tetracyclo[6,2,1,1$^{3,6}$,0$^{2,7}$]dodeoene-4,
9-decyl-tetracyclo[6,2,1,1$^{3,6}$,0$^{2,7}$]dodecene-4,
9,10-dimethyl-tetracyclo[6,2,1,1$^{3,6}$,0$^{2,7}$]dodecene-4,
9-methyl,10-ethyl-tetracyclo[6,2,1,1$^{3,6}$,0$^{2,7}$]dodecene-4,
9-cyclohexyl-tetracyclo[6,2,1,1$^{3,6}$,0$^{2,7}$]dodecene-4,
9-chloro-tetracyclo[6,2,1,1$^{3,6}$,0$^{2,7}$]dodecene-4,
9-bromo-tetracyclo[6,2,1,1$^{3,6}$,0$^{2,7}$]dodecene-4,
9-fluoro-tetracyclo[6,2,1,1$^{3,6}$,0$^{2,7}$]dodecene-4,
9-isobutyl-tetracyclo[6,2,1,1$^{3,6}$,0$^{2,7}$]dodecene-4, 9,10-dichloro-tetracyclo[6,2,1,1$^{3,6}$,0$^{2,7}$]dodecene-4, This invention especially contemplates the use of one or more of the following monomers so as to provide either homopolymers or copolymers upon polymerization. Copolymers are defined as polymers composed of two or more monomers:
norbornene,
5-vinyl-norbornene,
methylnorbornene,
tetracyclododecene,
methyltetracyclododecene,
dicyclopentadiene,
5-ethylidenyl-2-norbornene (ethylidene norbornene),
hexacycloheptadecene, and
tricyclopentadiene.

Other monomers can form part of the polynorbornenes such as non-conjugated acyclic olefins, monocyclic olefins and diolefins. The non-conjugated acyclic olefins act as chain terminators. Terminal olefins are most preferred, e.g., alpha-olephins. Thus monomers like hexene-1 are preferred while 1-butene, 2-pentene, 4-methyl-2-pentene, and 5-ethyl-3-octene are suitable also. They are typically used at a molar ratio of 0.001:1 to 0.5:1 acyclic olefin to cycloolefin monomer.

The polynorbornenes used in forming the printed wire boards of the present invention are obtained by solution polymerization. For solution polymerization, the catalyst preferably comprises molybdenum or tungsten salts and the co-catalyst preferably comprises dialkylaluminum halides, alkylaluminum dihalides, alkylalkoxy halide or a mixture of trialkylaluminum with an iodine source.

Examples of useful molybdenum and tungsten salts include the halides such as chlorides, bromides, iodides, and fluorides. Specific examples of such halides include molybdenum pentachloride, molybdenum hexachloride, molybdenum pentabromide, molybdenum hexabromide, molybdenum pentaiodide, molybdenum hexafluoride, tungsten hexachloride, tungsten hexafluoride and the like. Other representative salts include those of acetylacetonates, sulfates, phosphates, nitrates, and the like. Mixtures of salts can also be used. The more preferred salts are the molybdenum halides, especially molybdenum pentahalides such as MoCl$_5$.

Specific examples of co-catalysts for ring-opening solution polymerization include alkyl-aluminum halides such as ethylaluminum sesquichloride, diethylaluminum chloride, diethylaluminum iodide, ethylaluminum diiodide, propylaluminum diiodide and ethylpropylaluminum iodide and a mixture of triethylaluminum and elemental iodine.

For solution polymerization, a molybdenum or tungsten salt is generally employed at a level from about 0.01 to about 50 millimoles per mole of total monomer, preferably from about 0.5 to about 10 millimoles per mole of total monomer, and the organoaluminum compounds described above are generally used in a molar ratio of organoaluminum compound to molybdenum and/or tungsten salt(s) from about 10/1 to about 1/3, preferably from about 5/1 to about 3/1. Both catalyst and co-catalyst for solution polymerization are normally added after the heating and at the time of polymerization.

Suitable solvents used for solution polymerization and in forming the dipping solution include aliphatic and cycloaliphatic hydrocarbon solvents containing 4 to 10 carbon atoms such as cyclohexane, cyclooctane and the like; aromatic hydrocarbon solvents containing 6 to 14 carbon atoms which are liquid or easily liquified such as benzene, toluene, xylene and the like; and substituted hydrocarbons wherein the substituents are inert such as dichloromethane, chloroform, chlorobenzene, dichlorobenzene and the like. Optionally present in the dipping solution are curing agents which initiate radical crosslinking such as the peroxides, di-t-butyl peroxide, or 2,5-dimethyl-2,5-di(t-butylperoxy)-hexyne-3. Antioxidants such as hindered phenol antioxidants (Ethyl 330) and polyunsaturated monomeric or oligomeric crosslinkers such as trimethylol propane triacrylate are also optional. The dipping solution has a solids content of preferably about 10% to about 40%. Dipping solutions having concentrations both above and below this range can be used in forming the laminates of this invention.

The dipping solution is impregnated into a non-cellulosic cloth, such as fiberglass, to form a substrate layer, often referred to as a prepreg. The cloth may be woven or non-woven. Many glass cloth materials having a variety of surface characteristics are available commercially. E-type fiberglass cloth, style 2116, having a surface finish type 642 or 627 (which refers to a silane investment) made by Burlington Industries is preferred. The non-cellulosic cloth is impregnated by immersing it in the dipping solution of the polynorbornene diluted in an organic solvent. This can be accomplished at ambient temperature or at temperatures above or below ambient temperature.

The glass cloth is preferably pretreated with a silane solution. A preferred class of pretreating agents is the styryl diamino silanes.

The prepreg so produced is typically dried at temperatures between ambient temperature and about 150° C. At final stages of drying the temperature is preferably maintained above the glass transition temperature (Tg) of the polymer to permit solvent to diffuse out. If curing agents are present, the temperature is kept sufficiently low to prevent activation of radical crosslinking.

Epoxy prepregs suitable for use in this invention are fully conventional and are readily commercially available. A particularly suitable epoxy prepreg comprises a commercial brominated epoxy/dicyandiamide B-stage prepreg. Some considerations for selecting resins for use in printed circuit boards are disclosed in "Some approaches to low dielectric constant matrix resin for printed circuit boards", Butler et al., National SAMPE Technical Conference, Oct. 4–6, 1983, which disclosure is hereby incorporated by reference herein.

The laminates produced by the present invention incorporate a conductive foil, preferably a copper film with a copper surface layer, such as copper foil. This copper foil can be part of the surface layer of other metallic films. The copper surface layer is pretreated with a silane solution which increases the bond strength between the substrate and the copper surface layer. Preferably, copper foil of the type manufactured for printed wiring boards with a matte side for lamination to a prepreg is pretreated with such a solution of silane coupling agent before being laminated to the prepreg. Such copper foils are typically about 35 microns thick and have a dendritic bronze matte surface.

Particularly suitable foils for use between the epoxy and polynorbornene layers of this invention are copper foils which have been treated on each surface to provide a dendritic bronze matte surface. A particularly preferred foil is TC/TC double treated copper foil available from Gould, Inc. Of course it will be appreciated by those of ordinary skill in the art that other electrically conductive metals can be employed as the foil layer.

Particularly suitable films for the outside layer are also available from Gould and are provided with a bronze matte coating on one side only.

The laminates are produced by assembling a substrate of starting prepreg and copper foil pretreated as discussed above, and laminating these two sheets together. The copper is then imaged and preferably etched as discussed above. Subsequently, a second prepreg layer (one or more layers of epoxy if the substrate prepregs are polynorbornenes or one or more layers of polynorbornenes if the substrate prepregs are epoxy) is laminated between the starting prepreg and an additional sheet of copper foil. Preferably the starting prepreg is laminated to two sheets of copper foil, one on each side, each of which is subsequently imaged and preferably etched. And preferably, two prepreg layers of dissimilar polymer (epoxy or polynorbornene as discussed, supra) along with one copper foil for each prepreg layer are laminated to each face of the starting laminate. Thus, using the sequence discussed above, if the starting prepregs are norbornene/etched copper/epoxy/copper laminate results. These layers can be built-up in alternating epoxy/polynorbornene sequence until the desired number of layers is reached. Any number of epoxy prepregs and polynorbornene prepregs can be employed in the prepreg layers. As used herein, the phrase "alternating layers" is not intended to limit this invention to strictly alternating epoxy/polynorbornene prepregs. Thus, it will be understood that several layers of epoxy prepregs can be employed with only one or two layers of polynorbornenes. Similarly, the polynorbornene and epoxy prepreg layers can comprise several prepregs and there is no practical limit on the number which can be employed in each layer. As used herein, the term "layer" refers to an assembly of prepregs which have been laminated together and cured, either independently of each other, or concurrently with other layers, optionally together with a layer of conductive film which, for example, has been etched (patterned) and oxidized.

Preferably, layers are arranged in a stacking sequence and laminated concurrently. For example, assuming a substrate having the sequence etched copper/polynorbornene/etched copper has been prepared, a sequence of copper foil/epoxy/substrate/epoxy/copper foil would be prepared and laminated under heat and pressure. In the simplest case for the production of printed circuit wiring boards, an assembly of polynorbornene/epoxy/copper, or epoxy/polynorbornene/copper would be prepared.

Alternatively, epoxy and/or polynorbornene layers can be prepared, and one or both faces of each layer laminated to a conductive film and cured, the lamination and cure of the epoxy and norbornene layers taking place independently. Thus, for example, a copper/epoxy/copper unit can be laminated and cured independently, and a copper/polynorbornene/copper unit can be laminated and cured independently such that the foregoing units are not yet laminated to each other, i.e., they exist as separate entities. One or more of the copper layers of each entity can then be subjected to photoresist imaging and etching to form a copper pattern. Subsequently, the polynorbornene can be subjected to silane pretreatment, followed by laminating and curing the etched polynorbornene unit with the etched epoxy unit to produce a printed wiring board.

In a preferred alternative embodiment, the interface between the outermost conductive foil layers of the assembly can include a sheet of polymer derived from a $C_2$-$C_4$ polymer, e.g., a polyethylene film, interposed between the norbornene layer and the conductive film. This serves to increase the bond strength between the conductive film layer and the polynorbornene layer, when the polynorbornene layer is the outermost layer of the multi-layer assembly. The polyethylene sheet may simply be placed between the polynorbornene and conductive film layers and the assembly subjected to fully conventional lamination and cure. Methods of employing such polyethylene films are more fully discussed in co-pending application Ser. No. 288,999 filed on Dec. 23, 1988, which application is hereby incorporated by reference herein for its teachings of how to employ polyethylene films in the laminates of this invention.

There are several silanes which are preferred for bonding substrate layers of polynorbornene impregnated glass to copper layers. The silane coupling agent is preferably in solution at concentrations ranging from about 1% to about 10% by weight. Suitable silanes include:

3-methylacryloyloxypropyltrimethoxysilane,
3-(N-styrylmethyl-2-aminoethylamino)propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyltrimethoxy silane hydrochloride.

The laminates of this invention are generally planar in shape. Thus, they have two major surfaces and four edge surfaces. The planar major surfaces are generally parallel to the planes of the laminations.

The resulting laminates comprise alternating layers of epoxy and polynorbornenes. Each layer comprises one or more epoxy or polynorbornene prepregs. In preferred embodiments, an etched copper pattern is laminated into the structure at the epoxy/polynorbornene interface. The copper pattern results from imaging and etching a layer of conductive metal foil, e.g., copper foil, on either a major surface of a epoxy layer or a polynorbornene layer. At least one, and preferably two conductive foil layers are present on the outer major surfaces of the printed circuit wiring boards of this invention.

The following examples are provided to illustrate preferred embodiments of the present invention. They are not intended to limit the scope of this disclosure to the embodiments exemplified therein. All percentages are by weight unless specified otherwise.

EXAMPLE 1

Step 1

Preparation of 65/35 (wt/wt) Methyltetracyclododecene (MTD) Vinyl-Norbornene (VNB) Copolymer An unsaturated polynorbornene polymer was obtained in the following manner. Into a septum-capped vessel containing 30 g. of molecular sieves were added 81 g. of dry toluene, 10.22 g. of methyl tetracyclododecene, 5.73 g. vinyl norbornene and 4.90 g. hexene-1. The contents were mixed and this mixture was allowed to stand 30 minutes, then transferred to a second vessel by passing it through a micron filter under nitrogen pressure. The vessel was slightly pressurized with nitrogen. To the mixture 0.23 cc of a 25% solution of ethyl-aluminum/sesquichloride (EASC cocatalyst) in dry toluene were introduced by syringe. To this mixture, 1.65 cc of a solution of 2 g. of molybdenum pentachloride catalyst in 39 g. of dry ethylacetate and 84 g. of dry toluene, were also introduced by syringe. Within one minute, an exothermic reaction of the mixture resulted and the mixture became a viscous liquid. After 15 minutes, 60 cc of a 88/12 (wt/wt) mixture of 2-propanol and water was added to the vessel and the contents shaken to inactivate the catalyst. The top layer, containing mostly solvents, residual monomers and low molecular weight polymers, was poured off. The semisolid bottom layer was redissolved in 100 cc of toluene, washed with water and dried by azeotropic distillation of part of the solvent.

Polymerization was found to be 91% conversion of monomer as calculated by measuring the percent weight solids of the resulting polymer solution. The glass transition temperature (Tg) was found to be 118° C. in the second heat, as calculated from a Differential Scanning Calorimetry curve of a sample of the polymer that was diluted in toluene, precipitated into methanol with stirring, filtered and dried.

Step 2

Preparation of Prepreg

The prepreg formulation used consisted of a 23% solution of a 65/35 (wt/wt) copolymer of methyltetracyclodocene (MTD) and 5-vinyl-2-norbornene (VNB) also containing 3.5 p.h.r (parts per hundred resin) of Lupersol 130, peroxide from Penwalt Co. Lucidol Division, and 1 p.h.r. of Irganox antioxidant from Ciba-Geigy Co. The polymer had a dilute solution viscosity (DSV) in toluene of 0.5 and it was obtained by ring opening polymerization of above monomers in toluene, in the presence of hexene-1 as a molecular weight modifier, using molybdenum pentachloride and ethyl-aluminum sesquichloride as the catalyst system.

The above formulation was impregnated, by dipping, onto a glass cloth style 2116, having a finish 642 from Burlington Industries. After air drying to a tack-free condition, the residual solvent was eliminated in a mechanical convection oven for 15 minutes at 50° C., 15 at 75° C., 20 at 100° C. and 10 at 130° C. The residual amount of volatiles was measured to be below 2.5% at 200° C. by Thermogravimetric Analysis.

Step 3

Pretreatment of Copper Foil with a Silane

Two layers of above prepregs were laminated inbetween electrodeposited copper foil, containing a proprietary bronze treatment on the matte side (TC treatment from Gould Inc., Foil Division). Prior to lamination the copper foil was treated for 1 minute by dipping in a 0.4% solution of 3-(N-styrylmethyl-2-aminoethyl)-aminopropyltrimethoxysilane hydrochloride in methanol as an adhesion promoter. The treated foil was subjected to a short bake for 5 minutes at 105° C. The lamination and cure was performed in a press at from 40° to 190 C. for 25 minutes and, isothermally at 190° C. for 3 hrs., using a pressure of 700 psi. At this point the copper peel strength was above 8 lbs/in and the sample passed, without blistering, the thermal stress test in a molten solder bath for 20 seconds at 288° C.

Step 4

Lamination of Copper Foil to the Prepreg

The copper on both sides of the laminate was imaged and etched using a 1 molar solution of ammonium persulfate. The etched board was at this point a cured substituted polynorbornene C-stage board. Based on ESCA (Electron Spectroscopy for Chemical Analysys) determination of silicon and nitrogen on the board surface, the copper adhesion promoter remained unetched on the board surface in the areas where the copper was removed. The copper pattern was treated with an oxidant to produce an oxide coating on the surface of the pattern.

Step 5

Lamination of Additional Prepregs of Dissimilar Polymer

In order to prepare a multi-layer board, on each side of the above polynorbornene core were laminated two layers of a commercial brominated epoxy/discyandiimide B-stage prepreg and, two copper foils on the outside, respectively (one on each side). These copper foils were not pretreated with the adhesion promoter as described in Step 3, since in the manufacturing of commercial epoxy boards this treatment is not required. The lamination and cure was performed under the same temperature and pressure cycle as above. At this point, the sample passed the thermal stress test of 20 seconds at 288° C., showing good adhesion between the polynorbornene and the epoxy layers as well as between the epoxy layer and the copper foil.

Step 6

Lamination of Additional Copper Foils

The copper foil on the above laminate was imaged and etched as in Step 4, using a 1 molar solution of ammonium persulfate, followed by oxidation.

Step 7

Adhesion Promotion

The hybrid board having C-Stage epoxy layers on the outside and the cured polynorbornene copolymer core was adhesion promoted by treatment for 1 minute with the same 0.4% solution in methanol of the silane compound used in Step 3, after which it was dried in air at 105° C. for 5 minutes.

Step 8

Lamination of Additional Prepreg

The treated board was further laminated with 2 layers on each side, of uncured polynorbornene prepregs prepared as in Step 2, and with adhesion promoted copper foils prepared as in Step 3.

The lamination and cure was performed as described above using 700 psi pressure and a temperature cycle from 40° C. to 190° C. with 25 minutes and then isothermally at 190° C. for 3 hours. At this point the hybrid board was subjected to a thermal stress test for 20 seconds at 260° C. and 20 seconds at 288° C. There was no blistering or delamination between the dissimilar epoxy and polynorbornene layers or between the copper foil and the outside polynorbornene layer.

The hybrid multi-layer printed circuit wiring board described in this example comprises, thus, 3 layers of cured polynorbornene copolymer/glass cloth composite alternating with two layers of commercial cured brominated epoxy/glass cloth composite.

EXAMPLE 2

Example 1 was repeated except the adhesion promotion treatment in Step 7 was not performed.

The board was subjected to a thermal stress test for 20 seconds at 260° C. and showed delamination between the epoxy and the outside polynorbornene layers.

While this invention has been disclosed in this patent application by reference to the details of preferred embodiments of the invention, it is to be understood that this disclosure is intended in an illustrative rather than in a limiting sense, as it is contemplated that modifications will readily occur to those skilled in the art, within the spirit of the invention and the scope of the appended claims.

What is claimed is:

1. A process of producing a laminate comprising the steps of:
   (a) providing a substrate layer comprising at least one polynorbornene prepreg;
   (b) pretreating the surface of a conductive film with a solution of a silane compound effective to increase the bond strength between the substrate layer and the conductive film and laminating the conductive film to the substrate layer and curing said substrate;
   (c) photo-resist imaging and etching at least a portion of the conductive film; and
   (d) sandwiching and laminating an additional layer, formed of at least one epoxy prepreg, between the etched surface of the substrate and the surface of an additional conductive film, wherein the silane employed in step (b) is effective to increase the bond strength between the metal film and the polynorbornene layer, and the polynorbornene layer and the epoxy layer.

2. A process of claim 1 wherein the conductive film is copper and a surface of the copper film has a bronze coating.

3. A process of claim 2 wherein each surface of the copper film has a bronze coating.

4. A process of claim 1 wherein the polynorbornene polymer is unsaturated and is derived from a cycloolefin monomer selected from methyltetracyclododecene, vinyl-norbornene or dicyclopentadiene.

5. A process of claim 1 wherein the monomers of the polynorbornene polymer comprise in weight to weight ratio about 50–75 percent methyltetracyclododecene to 25–50 percent vinylnorbornene.

6. A process of claim 1 wherein the monomers of the polynorbornene polymer comprise in weight-to-weight ratio about 75–90 percent dicyclopentadiene to about 10–25 percent vinyl-norbornene.

7. A process of claim 1 wherein polynorbornene prepregs are prepared by immersing a glass cloth in a dipping solution comprising norbornene monomers and a curing agent which initiates radical crosslinking.

8. A process of claim 1 wherein the silane is selected from the group consisting of 3-methylacryloyloxypropyltrimethoxysilane, 3-(N-styrylmethyl-2aminoethylamino) propyltrimethoxysilane hydrochloride, 3-(N-allyl-2-aminoethylamino)-propyltrimethoxysilane hydrochloride, N-(styrylmethyl)-3-aminopropyltrimethoxysilane hydrochloride, N-2-aminoethyl-3-aminopropyltrimethoxysilane, and 3-(N-Benzyl-2-aminoethylamino)-propyltrimethoxy silane hydrochloride.

9. A process of claim 1 wherein the lamination is performed at a temperature above the glass transition temperature of the polynorbornene.

10. A process of claim 1 wherein the lamination is performed at temperatures between about ambient and about 250° C. and at a pressure of from about 500–1100 PSI.

11. A process of claim 2 further comprising placing one or more substrate layers in a stacking sequence with one or more epoxy layers and one or two copper layers at the outside of the stack.

12. A process of claim 7 wherein the cloth of each step is impregnated with from 30% to 80% by weight polymer.

13. A process of claim 1 wherein at least one of the copper film layers is imaged and completely etched prior to a subsequent laminating step.

14. A process of claim 13 wherein the copper pattern resulting from etching the image is subjected to oxidation prior to further lamination steps.

15. A process of claim 1 further comprising continuing steps (a) through (d) to produce a laminate of the sequence comprising copper/epoxy/etched copper/polynorbornene/etched copper/epoxy/copper.

16. A process of claim 1 wherein, between steps (c) and (d), the patterned substrate layer is further treated with a silane coupling agent.

17. A process of claim 1 further comprising the step of interposing a layer of film derived from a $C_2$–$C_4$ polymer between the polynorbornene layer and the conductive film prior to curing the polynorbornene layer.

18. A process of producing a laminate comprising the steps of:
   (a) providing a substrate layer comprising at least one epoxy prepreg;
   (b) laminating a conductive film to a surface of said substrate and curing said substrate;
   (c) photo-resist imaging and etching at least a portion of the conductive film to produce a copper-patterned surface on the substrate;
   (d) providing an additional layer comprising a polynorbornene prepreg and pretreating the copper-patterned surface of the substrate layer with a silane solution effective to increase the bond strength between the copper-patterned surface and the polynorbornene layer;
   (e) pretreating the surface of an additional conductive film with a silane solution effective to increase the bond strength between the conductive film and the polynorbornene layer; and
   (f) sandwiching, laminating and curing the polynorbornene layer between the copper-patterned surface of the substrate and the silane-treated surface of the conductive film.

19. A process of claim 18 wherein the polynorbornene polymer is derived from a cycloolefin monomer selected from methyltetracyclododecene, vinylnorbornene or dicyclopentadiene.

20. A process of claim 18 wherein the monomers of the polynorbornene polymer comprise in a weight to weight ratio about 50–75 percent methyltetracyclododecene to 25–50 percent vinyl-norbornene.

21. A process of claim 18 wherein the monomers of the polynorbornene polymer comprise in weight-toweight ratio of about 75–90 percent dicyclopentadiene to about 10–25 percent vinyl-norbornene.

22. A process of claim 18 wherein polynorbornene prepregs are prepared by immersing a glass cloth in a dipping solution comprising norbornene monomers and a curing agent which initiates radical crosslinking.

23. A process of claim 18 wherein the silane is selected from the group consisting of
3-methylacryloyloxypropyltrimethoxysilane,
3-(N-styrylmethyl-2-aminoethylamino)propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyltrimethoxy silane hydrochloride.

24. A process of claim 18 wherein the lamination is performed at a temperature above the glass transition temperature of the polynorbornene.

25. A process of claim 18 wherein the lamination is performed at temperatures between about ambient and about 250° C. and at a pressure of from about 500–1100 PSI.

26. A process of claim 18 further comprising placing one or more substrate layers in a stacking sequence with two or more polynorbornene layers and two or more copper layers at the outside of the stack.

27. A process of claim 18 wherein the cloth of each step is impregnated with from 30% to 80% by weight polymer.

28. A process of claim 18 wherein at least one of the copper film layers is imaged and completely etched prior to a subsequent laminating step.

29. A process of claim 28 wherein the copper pattern resulting from etching the image is subjected to oxidation prior to further lamination steps.

30. A process of claim 18 further comprising continuing steps (a) through (d) to produce a laminate of the sequence comprising copper/polynorbornene/etched copper/epoxy/etched copper/polynorbornene/copper.

31. A process of claim 18 wherein, between steps (c) and (d), the patterned substrate layer is further treated with a silane coupling agent.

32. A process of claim 17 further comprising the step of interposing a layer of polyolefin film derived from a $C_2$–$C_4$ polymer between the polynorbornene layer and the conductive film prior to the lamination and cure of step (f).

33. A process of producing a laminate, comprising the steps of:
(a) providing a polynorbornene solution comprising polynorbornene polymers dissolved within a solvent;
(b) impregnating a non-cellulosic cloth with the solution and drying the impregnated cloth to remove a substantial portion of solvent to form a substrate layer;
(c) pretreating a surface of a sheet comprising at least partially-cured epoxy resin with a solution of a silane compound effective to increase the bond strength between the substrate layer and epoxy layer; and
(d) laminating the epoxy layer to the substrate layer.

34. A printed circuit wiring board produced by a process of claim 1.

35. A printed circuit wiring board produced by a process of claim 18.

36. A laminate comprising at least one layer comprising at least one epoxy prepreg layer laminated to at least one polynorbornene prepreg layer comprising at least one polynorbornene prepreg.

37. A multi-layer printed circuit wiring board comprising at least one epoxy layer laminated to at least one polynorbornene layer, an etched conductive metal pattern between the epoxy layer and the polynorbornene layer and a conductive metal film on at least one major surface of the laminate; said epoxy layer comprising at least one epoxy prepreg and said polynorbornene layer comprising at least one polynorbornene prepreg.

38. A printed circuit wiring board of claim 37 wherein the epoxy layer has a dielectric constant of 4.8 or less and a dissipation factor of 0.02 or less, and the polynorbornene layer has a dielectric constant of 3.1 or less and a dissipation factor of 0.002 or less.

39. A printed circuit wiring board of claim 38 wherein the polynorbornene layer has a dielectric constant of 2.8 or less.

40. A printed circuit wiring board of claim 39 capable of withstanding immersion in a molten solder bath which is at a temperature of at least 260° C., for a period of at least 20 seconds.

41. A multilayer wire board of claim 37 comprising at least one layer of polynorbornene adhered to at least one layer of conductive film and wherein a sheet of film derived from a $C_2$–$C_4$ polymer is interposed between the polynorbornene layer and the conductive film.

42. A process of producing a laminate comprising the steps of:
(a) providing a substrate layer comprising at least one polynorbornene prepreg;
(b) pretreating the surface of a conductive film with a solution of a silane compound effective to increase the bond strength between the substrate layer and the conductive film and laminating the conductive film to the substrate layer and curing said substrate;
(c) photo-resist imaging and etching at least a portion of the conductive film; and
(d) laminating an additional layer, formed of at least one epoxy prepreg, to the etched surface of the substrate and curing the assembly, wherein the silane employed in step (b) is effective to increase the bond strength between the metal film and the polynorbornene layer, and the polynorbornene layer and the epoxy layer.

43. A process of producing a laminate comprising the steps of:
(a) providing a substrate layer comprising at least one epoxy prepreg;
(b) laminating a conductive film to a surface of said substrate and curing said substrate;
(c) photo-resist imaging and etching at least a portion of the conductive film to produce a copper-patterned surface on the substrate;
(d) providing an additional layer comprising a polynorbornene prepreg and pretreating the copper-patterned surface of the substrate layer with a silane solution effective to increase the bond strength between the copper-patterned surface and the polynorbornene layer; and
(e) laminating and curing the polynorbornene layer to the copper-patterned surface of the substrate.

* * * * *